United States Patent
Yin et al.

(10) Patent No.: US 10,859,621 B2
(45) Date of Patent: Dec. 8, 2020

(54) ELECTROMAGNETIC INTERFERENCE OBJECTIVE COMPLEXITY EVALUATION METHOD BASED ON FAST S-TRANSFORMATION TIME-FREQUENCY SPACE MODEL

(71) Applicant: WUHAN UNIVERSITY, Hubei (CN)

(72) Inventors: Baiqiang Yin, Hubei (CN); Yigang He, Hubei (CN); Bing Li, Hubei (CN); Lei Zuo, Hubei (CN); Hui Zhang, Hubei (CN); Shudong Wang, Hubei (CN)

(73) Assignee: WUHAN UNIVERSITY, Hubei (CN)

(*) Notice: Subject to any disclaimer, the term of this patent is extended or adjusted under 35 U.S.C. 154(b) by 273 days.

(21) Appl. No.: 16/046,984

(22) Filed: Jul. 26, 2018

(65) Prior Publication Data
US 2019/0285681 A1 Sep. 19, 2019

(30) Foreign Application Priority Data
Mar. 16, 2018 (CN) .......................... 2018 1 0220095

(51) Int. Cl.
*G01R 31/00* (2006.01)
(52) U.S. Cl.
CPC .................... *G01R 31/001* (2013.01)
(58) Field of Classification Search
CPC ...... G01R 31/001; G01R 31/002; G06F 11/20
See application file for complete search history.

(56) References Cited

U.S. PATENT DOCUMENTS

2003/0210045 A1* 11/2003 Mitchell ............... G01R 33/56
 324/307
2003/0212490 A1* 11/2003 Mitchell ............... G06K 9/6253
 702/1
(Continued)

*Primary Examiner* — Manuel A Rivera Vargas
*Assistant Examiner* — Yaritza H Perez Bermudez
(74) *Attorney, Agent, or Firm* — JCIPRNET

(57) ABSTRACT

An electromagnetic interference objective complexity evaluation method based on a fast S-transformation time-frequency space model comprises the following steps: (1) carrying out fast S-transformation on space electromagnetic signals acquired in real time to obtain a fast speed S-transformation two-dimensional time-frequency matrix of the signal; (2) calculating time domain occupancy rate $T_P$, frequency occupancy rate $F_P$, and energy occupancy rate $E_P$ of an evaluation object and interference signals in the fast speed S-transformation two-dimensional time-frequency matrix; (3) calculating electromagnetic interference objective complexity $C=T_P*F_P*E_P$ according to the time-frequency space model; and (4) finding a grading standard according to an objective complexity value so as to determine an electromagnetic interference objective complexity type. Compared with the prior art, the electromagnetic interference objective complexity evaluation method based on the fast S-transformation time-frequency space model has the characteristics that a fast S-transformation method is adopted, one-dimensional limitation of Fourier transformation is overcome, three evaluation parameters including the time domain occupancy rate, the frequency occupancy rate and the energy occupancy rate can be rapidly extracted simultaneously, and by adopting the time-frequency space model, the problem of synchronous and overall evaluation of multiple evaluation parameters can be effectively solved.

4 Claims, 6 Drawing Sheets

(56) References Cited

U.S. PATENT DOCUMENTS

| | | | |
|---|---|---|---|
| 2003/0212491 A1* | 11/2003 | Mitchell | G06F 17/14 |
| | | | 702/1 |
| 2005/0254588 A1* | 11/2005 | Kim | G10L 19/035 |
| | | | 375/260 |
| 2014/0288843 A1* | 9/2014 | De Meersman | G01V 1/364 |
| | | | 702/17 |
| 2016/0249862 A1* | 9/2016 | Ansari | A61B 5/08 |
| | | | 702/191 |
| 2017/0326937 A1* | 11/2017 | Miska | B60G 17/08 |
| 2019/0079205 A1* | 3/2019 | Van Manen | G01V 1/364 |
| 2019/0099075 A1* | 4/2019 | Gavas | A61B 3/113 |

* cited by examiner

ELECTROMAGNETIC INTERFERENCE OBJECTIVE COMPLEXITY EVALUATION METHOD BASED ON FAST S-TRANSFORMATION TIME-FREQUENCY SPACE MODEL

CROSS-REFERENCE TO RELATED APPLICATION

This application claims the priority benefit of China application serial no. 201810220095.6, filed on Mar. 16, 2018. The entirety of the above-mentioned patent application is hereby incorporated by reference herein and made a part of this specification.

BACKGROUND OF THE INVENTION

1. Field of the Invention

The present invention belongs to the field of electromagnetic signal processing, and particularly relates to an electromagnetic interference objective complexity evaluation method based on a fast S-transformation time-frequency space model.

2. Description of Related Art

Electromagnetic interference is one of the prime factors which affect normal communication of electronic equipment. In recent years, faults of the electronic equipment caused by complex electromagnetic environments and same frequency electromagnetic interference frequently occur, heat effect and a high field effect caused by the electromagnetic interference may lead to malfunctions of local electronic equipment, partial functions of electronic equipment may fail, and in severe case, the electronic equipment may catch fire accidentally to cause serious accidents. In the face of an increasingly complex electromagnetic application environment, the way of correctly evaluating the complexity of an electromagnetic environment in which the electronic equipment is located and effectively preventing electromagnetic interference becomes a current research hotspot. Although many factors affect the complexity of the electromagnetic environment and accurate representation from time domain, frequency domain and energy domain is difficult, the present literature research results show that the complexity of the electromagnetic environment is closely related to time-frequency characteristics and energy distribution. Existing research literatures start from single indexes separately, related independent parameters are extracted, and the corresponding electromagnetic environment complexity grades are determined according to independent parameter distribution percentage of national military standard. However, in the method, integrity of an evaluation object is ignored, evaluation parameters lack the corresponding overall model, and the interrelation between an interference object and the evaluation object in terms of time, frequency and power cannot be described definitely.

SUMMARY OF THE INVENTION

The present invention is directed to solve the technical problem of synchronous extraction of evaluation parameters of an existing complex electromagnetic environment and that qualitative and quantitative evaluation are difficult for evaluation of an existing complex electromagnetic environment using the same method. An electromagnetic interference objective complexity evaluation method based on a fast S-transformation time-frequency space model is used, the method is high in universality, time-frequency evaluation characteristic parameters can be extracted effectively by adopting the fast S-transformation time-frequency space model, and overall evaluation parameters can accurately reflect electromagnetic interference intensity; and the method is simple to implement, various parameter measuring equipment is not required, and extraction and real-time evaluation of multiple evaluation parameters can be realized under the condition of single signal acquisition.

To solve the foregoing technical problem, the present invention adopts the following technical scheme:

An electromagnetic interference objective complexity evaluation method based on a fast S-transformation time-frequency space model comprises the following steps:

(1) carrying out fast S-transformation on space electromagnetic signals acquired in real time to obtain a fast S-transformation two-dimensional time-frequency matrix of the signal;

(2) calculating time domain occupancy rate $T_P$, frequency occupancy rate $F_P$ and energy occupancy rate $E_P$ of an evaluation object and interference signals in the fast S-transformation two-dimensional time-frequency matrix according to an S-transformation two-dimensional time-frequency matrix;

(3) calculating electromagnetic interference objective complexity $C=T_P*F_P*E_P$ according to the time-frequency space model consisting of the time domain occupancy rate, the frequency occupancy rate and the energy occupancy rate; and (4) finding a grading standard according to an objective complexity value so as to determine an electromagnetic interference objective complexity type.

According to the scheme, in step (1), fast S-transformation on a signal is a short-time Fourier transformation fast speed algorithm which takes a Gaussian function as a window function, the expression of the algorithm is $S(t,f)=\int_{-\infty}^{+\infty}[G(f+f')\cdot W(f',f)]\cdot e^{i2\pi f't}df'$, in the expression, $G(f+f')=\int_{-\infty}^{+\infty}x(t)\cdot e^{-i2\pi(f+f')\cdot t}dt$ is Fourier transformation of a space electromagnetic signal x(t) acquired in real time, $$W(f', f) = \int_{-\infty}^{+\infty} \frac{|f|}{\sqrt{2\pi}} \cdot e^{\left|-\frac{f^2(\tau-t)^2}{2}\right|} \cdot e^{-i2\pi f't} \cdot dt$$

is Fourier transformation of a Gaussian window function $$\psi(t) = \frac{1}{\sqrt{2}} e^{-\frac{t^2}{2}},$$

t is time, f' is sampling frequency, f is frequency, z is a time shift factor, and i is an imaginary number;

in step (2), the time domain occupancy rate $T_P$ is $$T_P = \int_{f_1}^{f_2} \left[ \frac{S(t, f) - S_0}{(t_2 - t_1)(f_2 - f_1)} \right] df,$$

in the expression, $t_1$ and $t_2$ are effective starting time and effective ending time respectively ($[t_1,t_2]$ is an effective time period), $f_1$ and $f_2$ are evaluated starting frequency and evaluated ending frequency respectively ($[f_1,f_2]$ is an evaluated starting and ending frequency range), S(t,f) is the fast S-transformation two-dimensional time-frequency matrix, and $S_0$ is a reference time-frequency matrix plane;

the frequency occupancy rate $F_P$ is $$F_P = \int_{t_1}^{t_2} \left[ \frac{S(t,f) - S_0}{(t_2-t_1)(f_2-f_1)} \right] dt;$$

and the energy occupancy rate $E_P$ is $$E_P = \frac{S(t,f) - S_0}{\max[S(t,f)] - S_0},$$

and in the expression, max [S(t,f)] is a maximum value in all elements of the S-transformation time-frequency matrix.

According to the scheme, in step (4), the grading standard is found according to the objective complexity value so as to determine the electromagnetic interference objective complexity type, and the grading standard of electromagnetic environment complexity is shown in table 1:

TABLE 1

| Grading standard of electromagnetic environment complexity (%) | | |
|---|---|---|
| Qualitative grade | Quantitative grade | Objective complexity C |
| General complexity | 1 | 0 < C ≤ 0.1 |
|  | 2 | 0.1 < C ≤ 0.8 |
|  | 3 | 0.8 < C ≤ 2.7 |
| Mild complexity | 4 | 2.7 < C ≤ 6.4 |
|  | 5 | 6.4 < C ≤ 12.5 |
| Moderate complexity | 6 | 12.5 < C ≤ 21.6 |
|  | 7 | 21.6 < C ≤ 34.3 |
| Severe complexity | 8 | 34.3 < C ≤ 51.2 |
|  | 9 | 51.2 < C ≤ 72.9 |
|  | 10 | 72.9 < C ≤ 100 |

A working principle of the present invention is as follows: firstly, complex electromagnetic signals acquired in real time are subjected to S-transformation to obtain time-frequency domain signal characteristics; and secondly, time domain occupancy rate, frequency occupancy rate and energy occupancy rate of an evaluation object and interference signals are calculated according to the reference time-frequency matrix plane $S_0$. Finally, the product of the time domain occupancy rate, the frequency occupancy rate and the energy occupancy rate is calculated according to the time-frequency space model, qualitative results and quantitative results of the corresponding electromagnetic environment complexities are found out according to the table, thus, qualitative evaluation and quantitative evaluation of a complex electromagnetic environment are realized, and theoretical basis is provided for electromagnetic interference protection and decision of complex electronic equipment in the complex electromagnetic environment.

Compared with the Prior Art, the Prevent Invention has the Beneficial Effects:

1. The method is simple to implement, various parameter measuring equipment is not required, one-dimensional limitation of Fourier transformation is overcome by adopting a fast S-transformation method, extraction and real-time evaluation of multiple evaluation parameters are realized under the condition of single signal acquisition, three evaluation parameters including the time domain occupancy rate, the frequency occupancy rate and the energy occupancy rate can be rapidly extracted simultaneously, and by adopting the time-frequency space model, the problem of synchronous and overall evaluation of multiple evaluation parameters can be effectively solved, the method is higher in calculating speed compared with traditional neural network method, besides being able to quantitatively evaluate a complex electromagnetic environment, the method is also able to qualitatively evaluate the electromagnetic environment.

2. The design method is high in universality, and is suitable for electromagnetic countermeasure evaluation under the unmasked and unshielded conditions, and also electromagnetic environment interference evaluation for a complex application environment before deployment of electronic equipment.

DESCRIPTION OF THE EMBODIMENTS

The present invention is further described in combination with the following accompanying drawings and embodiments.

Figure 1:
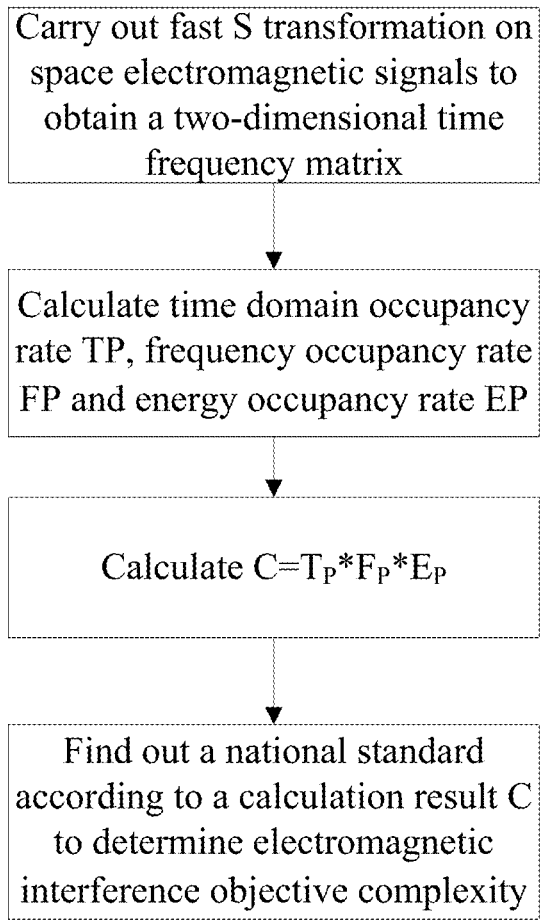
FIG. 1 is a flowchart of an electromagnetic interference objective complexity evaluation method based on a fast S-transformation time-frequency space model of the present invention.
Figure 2:
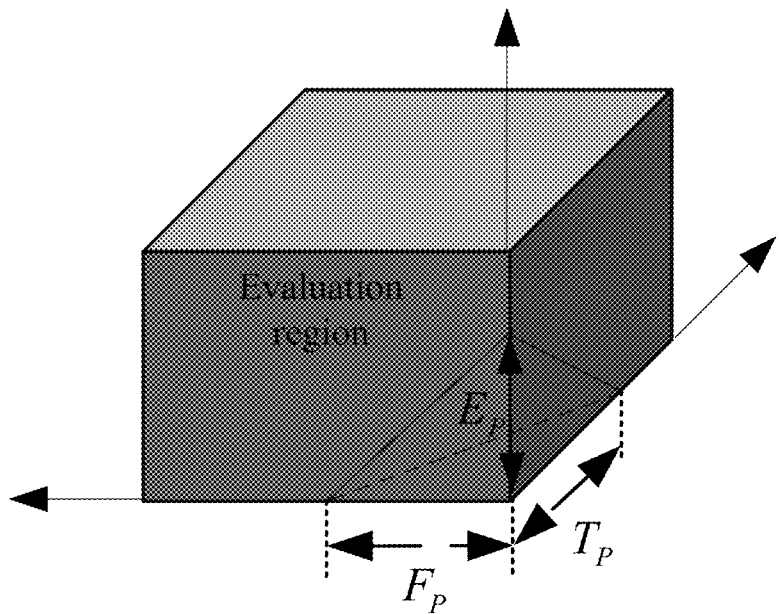
FIG. 2 is a time-frequency space model of an embodiment of the present invention.

Referring to FIG. 1, an electromagnetic interference objective complexity evaluation method based on a fast S-transformation time-frequency space model of the present invention comprises the following steps:

(1) carrying out fast S-transformation on space electromagnetic signals acquired in real time to obtain a fast speed S-transformation two-dimensional time-frequency matrix of the signal; fast S-transformation on a signal is a short-time Fourier transformation fast speed algorithm which takes a Gaussian function as a window function, the expression of the algorithm is $S(t,f) = \int_{-\infty}^{+\infty} [G(f+f') \cdot W(f',f)] \cdot e^{i2\pi f' t} df'$, in the expression, $G(f+f') = \int_{-\infty}^{+\infty} x(t) \cdot e^{-i2\pi \cdot (f+f') \cdot t} dt$ is Fourier transformation of a space electromagnetic signal x(t), $$W(f',f) = \int_{-\infty}^{+\infty} \frac{|f|}{\sqrt{2\pi}} \cdot e^{-\left|\frac{f^2(\tau-t)^2}{2}\right|} \cdot e^{-i2\pi f' t} \cdot dt$$

is Fourier transformation of a Gaussian window function $$\psi(t) = \frac{1}{\sqrt{2}} e^{-\frac{t^2}{2}},$$

t is time, f' is sampling frequency, f is frequency, τ is a time shift factor, and i is an imaginary number;

(2) calculating time domain occupancy rate $T_P$, frequency occupancy rate $F_P$ and energy occupancy rate $E_P$ of an evaluation object and interference signals in the fast S-transformation two-dimensional time-frequency matrix according to an S-transformation two-dimensional time-frequency matrix;

The time domain occupancy rate is $$T_P = \int_{f_1}^{f_2} \left[ \frac{S(t,f) - S_0}{(t_2 - t_1)(f_2 - f_1)} \right] df,$$

in the expression, $t_1$ and $t_2$ are effective starting time and effective ending time respectively, $f_1$ and $f_2$ are evaluated starting frequency and evaluated ending frequency respectively, S(t,f) is the fast S-transformation two-dimensional time-frequency matrix, and $S_0$ is a reference time-frequency matrix plane;

the frequency occupancy rate is $$F_P = \int_{t_1}^{t_2} \left[ \frac{S(t,f) - S_0}{(t_2 - t_1)(f_2 - f_1)} \right] dt;$$

the energy occupancy rate is $$E_P = \frac{S(t,f) - S_0}{\max[S(t,f)] - S_0},$$

and in the expression, max[S(t,f)] is a maximum value in all elements of the S-transformation time-frequency matrix;

(3) calculating electromagnetic interference objective complexity $C = T_P * F_P * E_P$ according to the time-frequency space model consisting of the time domain occupancy rate, the frequency occupancy rate and the energy occupancy rate; the time-frequency space model is shown in FIG. 2; and (4) finding a grading standard according to an objective complexity value so as to determine an electromagnetic interference objective complexity type; and the grading standard of electromagnetic environment complexity is shown in table 1.

Figure 3:
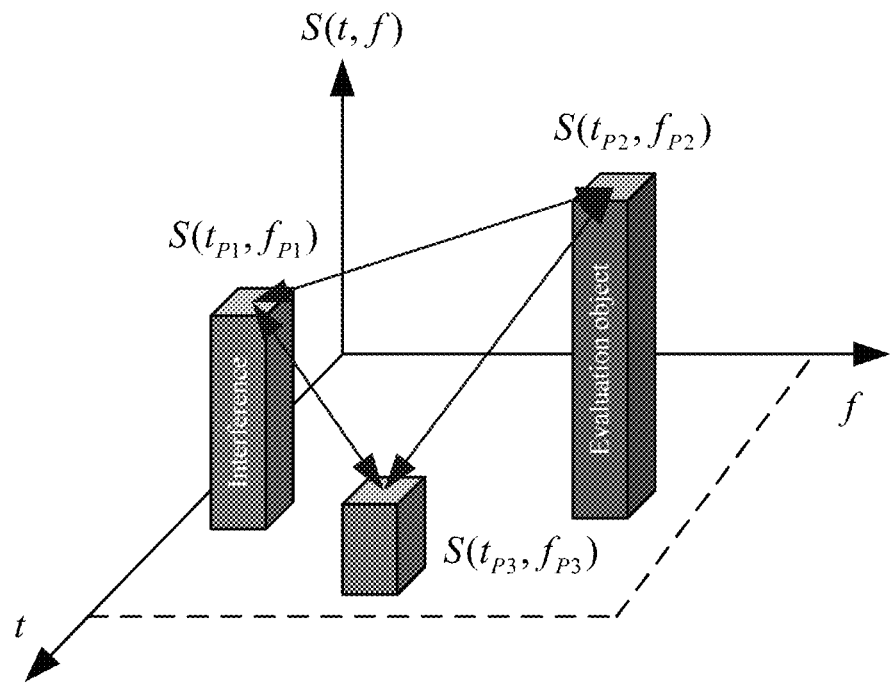
FIG. 3 is a schematic diagram of fast-S-transformation time-frequency space electromagnetic environment complexity evaluation.

I. A Principle of Fast S-Transformation is as Follows:

Let the wavelet transformation of a one-dimensional continuous complex electromagnetic signal, namely a space electromagnetic signal x(t), be defined as $$WT_x(\tau, a) = \frac{1}{\sqrt{a}} \int_{-\infty}^{+\infty} x(t) \psi_{a,\tau}\left(\frac{t-\tau}{a}\right) dt, \qquad (1)$$

wherein $$\psi_{a,\tau}\left(\frac{t-\tau}{a}\right)$$

is a wavelet basis function, T is a time shift factor, and a is a scale factor. When the wavelet basis function is a Gaussian window function $$\psi_{a,\tau}(t) = \frac{1}{\sqrt{2\pi}} e^{-\frac{t^2}{2}},$$

the corresponding wavelet transformation is $$WT_x(a, \tau) = \frac{1}{\sqrt{a}} \int_R^{+\infty} x(t) \frac{1}{\sqrt{2\pi}} e^{-\frac{(t-\tau)^2}{2a^2}} dt, \qquad (2)$$

two sides of expression (2) are simultaneously multiplied by a phase correction factor $e^{-2\pi at}$, wherein a=1/f, the amplitude thereof is subjected to $\sqrt{f}$ correction to obtain S transformation $S_T(\tau,f)$ as follows:

$$S_T(\tau, f) = \int_{-\infty}^{+\infty} x(t) \times \frac{|f|}{\sqrt{2\pi}} \times e^{\left[-\frac{f^2(\tau-t)^2}{2}\right]} \times e^{-i2\pi ft} dt, \qquad (3)$$

after the electromagnetic signal z(t) is subjected to S-transformation, a two-dimensional time-frequency matrix $S_T(\tau,f)$ can be obtained, wherein 7 axis reflects a time domain characteristic of the signal, f axis reflects a frequency domain characteristic of the signal, the magnitude of $S_T$ reflects the magnitude of energy on the time point and the frequency point, and an evaluation principle is shown in FIG. 3.

Because a signal frequency band range involved by an electromagnetic signal is wide, the number of signal sampling points is large, and a large amount of calculation is required during extraction of the evaluation parameters. In order to improve electromagnetic signal S-transformation efficiency and shorten parameter extraction time, a time-frequency parameter is extracted from the real-time electromagnetic signal by a fast S-transformation algorithm. If G(f') is Fourier transformation of the space electromagnetic signal x(t), W(f',f) is Fourier transformation of a Gaussian window function, $\psi_{a,\tau}(t)$, then $$G(f') = \int_{-\infty}^{+\infty} x(t) \cdot e^{-i2\pi f't} \cdot dt, \qquad (4)$$

$$W(f', f) = \int_{-\infty}^{+\infty} \frac{|f|}{\sqrt{2\pi}} \cdot e^{\left[-\frac{f^2(\tau-t)^2}{2}\right]} \cdot e^{-i2\pi f't} \cdot dt, \qquad (5)$$

fast S-transformation of the electromagnetic signal x(t) can be expressed as $$S(\tau,f) = \int_{-\infty}^{+\infty} [G(f+f') \cdot W(f',\sigma)] \cdot e^{i2\pi f'\tau} df' \qquad (6),$$

both G(f') and W(f',f) can be realized by a fast FFT algorithm, therefore, by the fast S-transformation method, fast calculation of the electromagnetic signal can be realized, signal parameter extraction time is shortened, and online real-time evaluation is realized.

II. A Time-Frequency Parameter Separation Calculation Method is as Follows:

A time-frequency matrix obtained by fast S-transformation of the electromagnetic signal can accurately reflect a time domain characteristic and a frequency domain characteristic of the signal, the size of the time-frequency matrix after fast S-transformation represents the magnitude of energy of a frequency point signal corresponding to the signal at the time point, therefore, after the working time and the frequency band range of the evaluation object are determined, the three evaluation indexes including the time domain occupancy rate, the frequency domain occupancy rate and the energy occupancy rate of a system can be synchronously and accurately calculated a two-dimensional time-frequency characteristic, which is obtained after fast S-transformation is implemented on the acquired signal.

If the evaluation object is positioned in a certain specific space $\Omega$ range, the effective time period is $[t_1,t_2]$ and the starting and ending frequency range is $[f_1,f_2]$, the ratio of the sum $K_P$ of durations of interference signals which exceed the reference time-frequency matrix plane $S_0$ to evaluation duration $t_2-t_1$ in an evaluation time range $t_1$ and $t_2$ is calculated according to the time-frequency distribution condition of main environmental electromagnetic interference signals, then the time domain occupancy rate of the interference signals can be obtained, and therefore, an S-transformation domain calculation expression of the time domain occupancy rate is $$T_P = \int_{f_1}^{f_2} \left[ \frac{S(t,f) - S_0}{(t_2-t_1)(f_2-f_1)} \right] df, \qquad (7)$$

wherein $0 \leq S_0 \leq \max[S_T(\tau,f)]$. $T_P$ reflects overlapping degree of the interference signals and the evaluation object in the time period. Along with increasing of $T_P$, possibility of interference to the evaluation object is increased.

In a similar way, the ratio of the sum $B_P$ of bandwidths occupied by frequency points of the interference signals which exceed the reference time-frequency matrix plane $S_0$ to evaluation bandwidth $f_2-f_1$ is calculated in an evaluation frequency band range $f_1$ and $f_2$, then the frequency domain occupancy rate of the interference signals can be obtained, the calculation expression is $$F_P = \int_{t_1}^{t_2} \left[ \frac{S(t,f) - S_0}{(t_2-t_1)(f_2-f_1)} \right] dt, \qquad (8)$$

the ratio of an electromagnetic interference signal S-transformation amplitude in the time period $[t_1,t_2]$ and the frequency range $[f_1,f_2]$ to the amplitude of the evaluation object can be calculated to obtain the following energy occupancy rate of interference electromagnetic signals:

$$E_P = \frac{S(t,f) - S_0}{\max[S(t,f)] - S_0}. \qquad (9)$$

III. Objective Complexity Evaluation Model

Because electromagnetic environment objective complexity describes the relation between an interference object and an evaluation region, the product of the time occupancy rate, the frequency occupancy rate and the energy occupancy rate of the interference signals in the region can be used for describing the influence of the interference signals to the region. If the maximum value of the time occupancy rate, the frequency occupancy rate and the energy occupancy rate in the region is 100%, and then the occupancy rate of the interference signals in the region can be expressed by a model as shown in FIG. 2.

If the evaluated electromagnetic interference objective complexity is expressed by C, then $$C = T_P * F_P * E_P \qquad (10).$$

In a traditional electromagnetic environment objective complexity evaluation method, electromagnetic environment complexity is graded by separation indexes, a 10-grade evaluation mode is adopted, and indexes such as different time occupancy rates, frequency occupancy rates, space occupancy rates and background noises can be qualitatively divided into four complexity grades including general complexity, mild complexity, moderate complexity and severe complexity as shown in table 2. The traditional electromagnetic environment complexity evaluation method quantifies single evaluation indexes, but ignores the circumstances that the method cannot objectively or correctly evaluate an electromagnetic environment when different indexes are intersected.

TABLE 2

| Grading standard of traditional electromagnetic environment complexity (%) | | | | |
|---|---|---|---|---|
| Qualitative grade | Quantitative grade | Occupancy rate/coverage rate | | |
| | | Time | Frequency | Space |
| General complexity | 1 | 0-10 | 0-10 | 0-10 |
| | 2 | 10-20 | 10-20 | 10-20 |
| | 3 | 20-30 | 20-30 | 20-30 |
| Mild complexity | 4 | 30-40 | 30-40 | 30-40 |
| | 5 | 40-50 | 40-50 | 40-50 |
| Moderate complexity | 6 | 50-60 | 50-60 | 50-60 |
| | 7 | 60-70 | 60-70 | 60-70 |
| Several complexity | 8 | 70-80 | 70-80 | 70-80 |
| | 9 | 80-90 | 80-90 | 80-90 |
| | 10 | 90-100 | 90-100 | 90-100 |

For example, when time occupancy is 5%, and frequency occupancy is 30%, the traditional method cannot evaluate the electromagnetic environment. Therefore, by utilizing time-frequency space overall evaluation model, one can effectively solve the evaluation problem of intersected parameter. During evaluation by the time-frequency space model, parameters are defined as shown in table 1. Evaluation indexes of objective complexity and subjective complexity are defined, and a signal working bandwidth B serves as an important performance index for the subjective complexity evaluation. Only when the interference signals are positioned in the effective bandwidth of the evaluation signal, the signal can effectively interfere with a target.

Application Embodiments

The method of the present invention is suitable for qualitative and quantitative evaluation of electromagnetic signal interference complexity in any complex electromagnetic environment. For convenience of illustration, a 13.56 MHz radiofrequency card is taken as an example to illustrate the design specification of the qualitative and quantitative evaluation of electromagnetic interference complexity.

Figure 4:
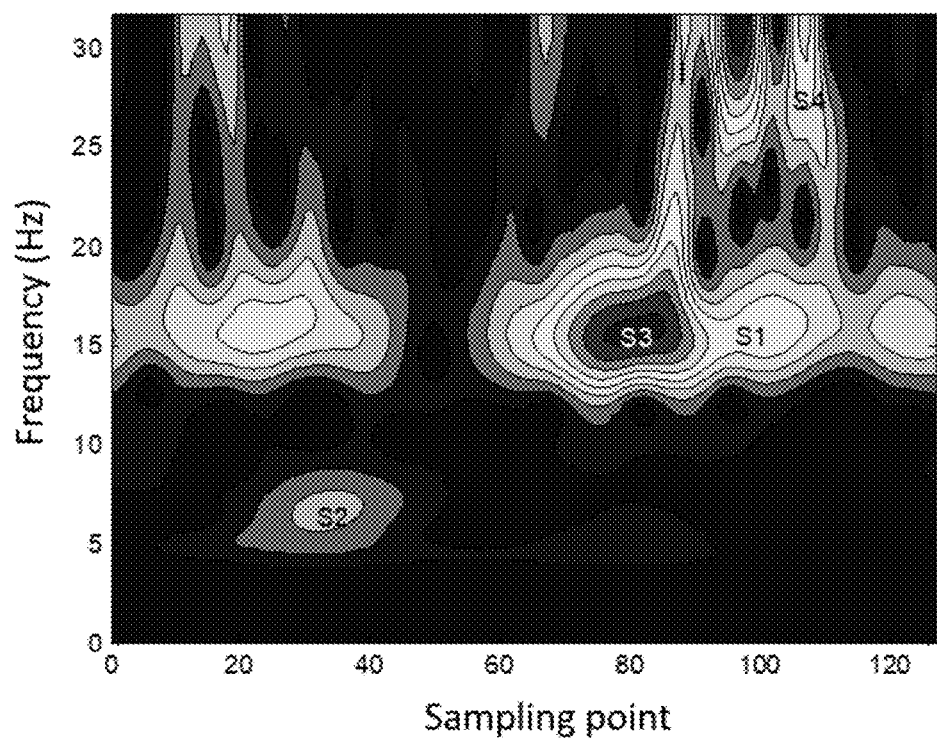
FIG. 4 is a contour diagram of simulated S-transformation two-dimensional time-frequency of a signal.
Figure 5:
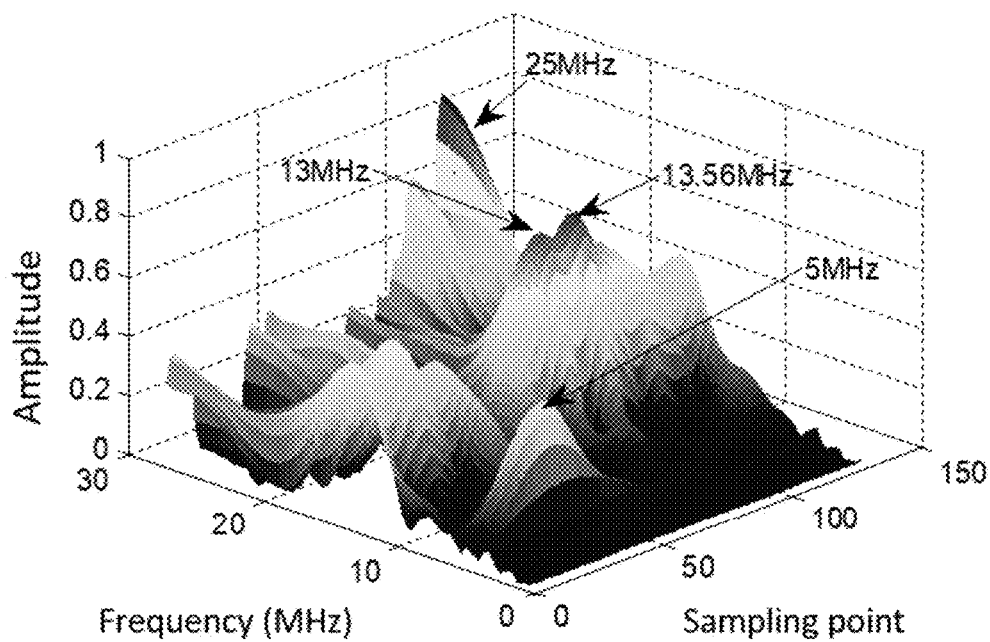
FIG. 5 is a contour diagram of simulated three-dimensional time-frequency of a signal.

During the design, it mainly includes the following points: at first, a simulation signal is sampled, the frequency of the simulation signal is assumed to be 13.56 MHz, and the frequencies of the interference signals are assumed to be 25 MHz, 13 MHz and 5 MHz respectively. A two-dimensional time-frequency contour diagram of the simulation signal after fast S-transformation is shown in FIG. 4. In FIG. 4, S1 represents the simulation signal of which the frequency is 13.56 MHz, S2, S3 and S4 respectively represent the interference signals of which the frequencies are 5 MHz, 13 MHz and 25 MHz, wherein although the interference signal of which the frequency is 5 MHz and the evaluation signal are both positioned in a time period of 20-40 on the time, the time occupancy rate of the interference signal is 100% and the frequency occupancy rate of the interference signal is 0 when the interference signal is analyzed from subjective complexity; on the contrary, the frequency occupancy rate of the interference signal S4 is 100%, but the time occupancy rate of the interference signal S4 is 0. Therefore, the interference signal S2 and the interference signal S4 do not interfere with the simulation signal S1, and the objective complexities C of the interference signal S2 and the interference signal S4 are equal to 0. As shown in FIG. 5, the interference signal S3 and the simulation signal S1 are partially overlapped on time-frequency. Therefore, in an actual evaluation process, only the interference signal S3 has electromagnetic interference to the evaluation object, and when time-frequency and energy intersection exists, the evaluation result is effective.

Figure 6A:
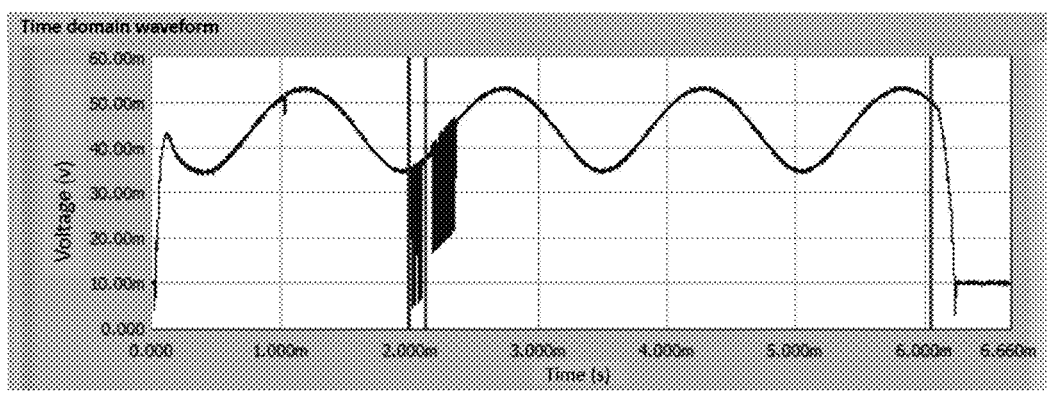
FIG. 6(a) is an S-transformation time domain test result under the effect of an interference signal 1.
Figure 6B:
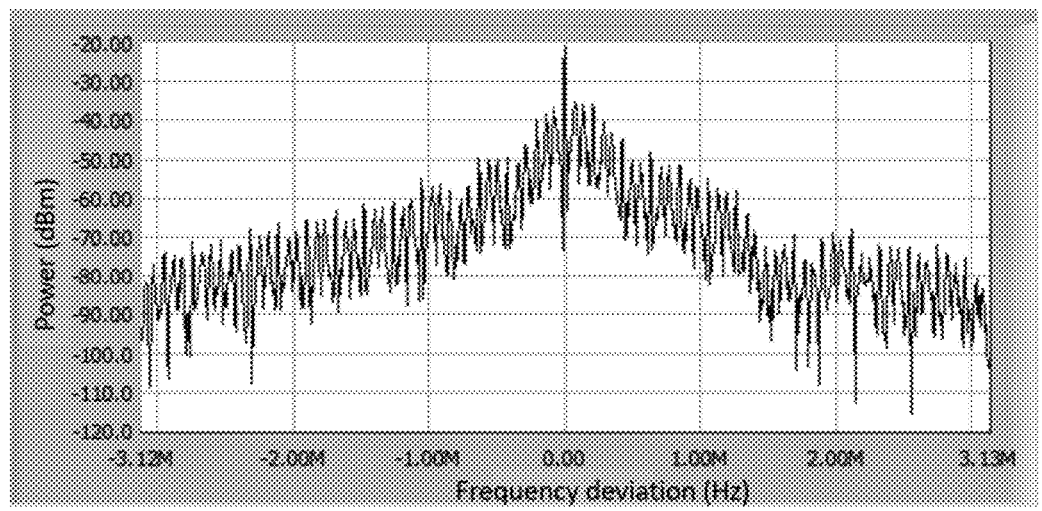
FIG. 6(b) is an S-transformation frequency domain parameter test result under the effect of an interference signal 1.
Figure 7A:
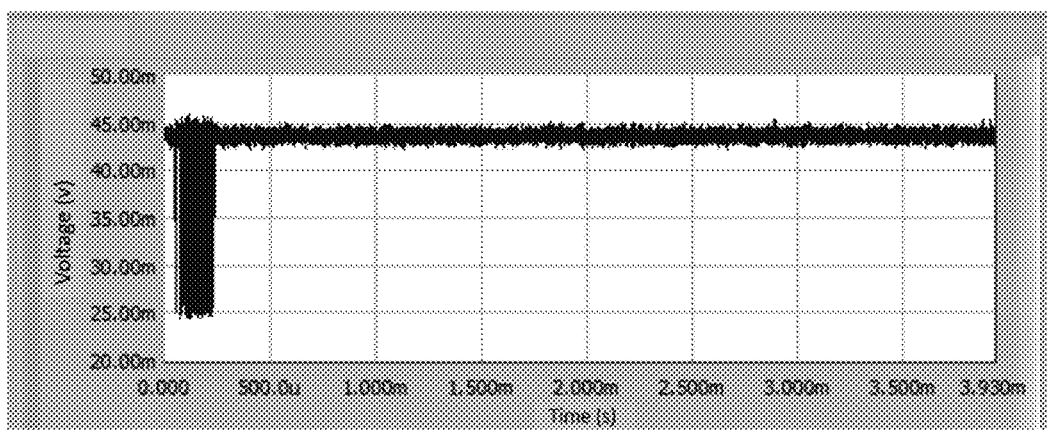
FIG. 7(a) is an S-transformation time domain test result under the effect of an interference signal 2.
Figure 7B:
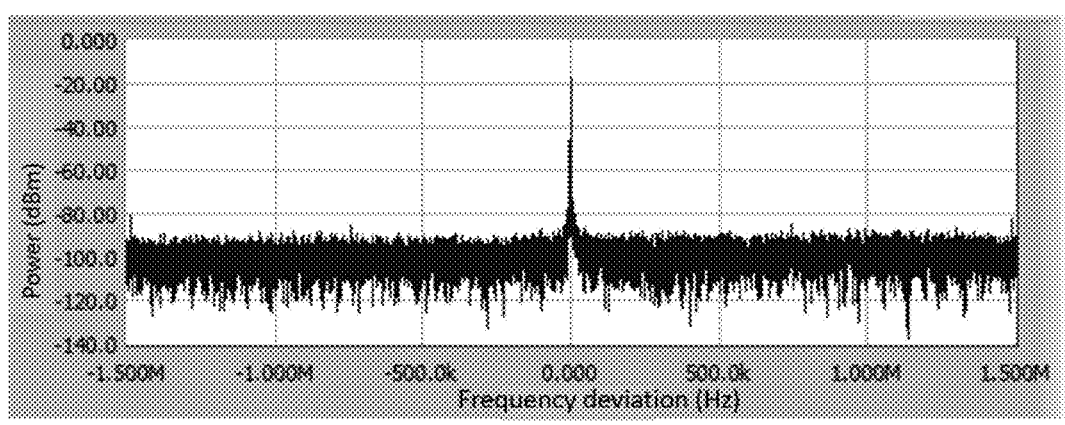
FIG. 7(b) is an S-transformation frequency domain parameter test result under the effect of an interference signal 2.

In an experiment, any waveform generator can be used for generating electromagnetic interference signals with different complexities to carry out deception electromagnetic interference and environment noise electromagnetic interference simulations on a radiofrequency bus card, and the real-time working performance of the radiofrequency bus card is tested under the condition of two electromagnetic interferences. In the experiment, a fast S-transformation Labview program radiofrequency identification (RFID) test system and a real-time spectrum analyzer which are integrated are used as monitoring equipment, the time-frequency parameter, the power parameter and the bandwidth parameter of a signal acquired in real time are monitored by fast S transformation, a monitored S-transformation time domain waveform of the bus card tested under the effect of an interference signal 1 in the experiment is shown in FIG. 6(a), frequency domain waveform is shown in FIG. 6(b), and signal occupancy bandwidth 1.257 MHz and in-band power of −20.30 dB can be calculated from FIG. 6(b). A monitored time domain waveform obtained under the effect of an interference signal 2 is shown in FIG. 7(a), frequency domain waveform is shown in FIG. 7(b). Signal occupancy bandwidth 748.00 Hz and in-band power of −17.20 dB can be calculated from FIG. 7(b). According to time-frequency parameter calculated results as shown in FIG. 6(a)-7(b), evaluation parameters of the bus card and the electromagnetic interference signals as shown in table 3 can be obtained. The interference signal 1 is same frequency deception interference, and the interference signal 2 is signal source simulated environment noise interference. The time domain occupancy rate, the frequency occupancy rate and the energy occupancy rate of the various interference signals to a bus card signal are calculated by expression (7) to expression (9) according to interference signal parameters as shown in table 3. Specific calculation results are shown in table 4. An objective complexity evaluation parameter can be calculated according to expression (10), and the evaluation result is shown in table 5. As shown in table 4, it can be known that under the effect of the interference signal 1, the subjective complexity is 16.8%, the electromagnetic interference complexity grade is quite difficult to determine from table 1, but by adopting a time-frequency combined model classification standard which is newly proposed by the present embodiment, it can be known that the interference electromagnetic complexity grade is moderate complexity, according to national military standard electromagnetic environment complexity definition, the performance of equipment will be affected to a certain extent under the effect of the moderate complexity interference signals, and the correctness of the method proposed by the present embodiment is verified by test waveform and shown in FIG. 6(a). From the obtained test result, which is less than 0.01%, of the interference signal 2 as shown in table 4, the waveform of the system are not affected under interference of environment noises, as shown in FIG. 7(a). From table 1 and table 2, it can be known that the electromagnetic interference complexity is general complexity.

TABLE 3

Bus card and electromagnetic interference signal parameter table

| Signal style | Signal time-frequency energy parameter | | | |
|---|---|---|---|---|
| | Center frequency | Duration | Bandwidth | Receiving power |
| Bus card signal | 13.56 MHz | 60 s | 1.25 MHz | −20 dB |
| Interference signal 1 | 13.56 MHz | 60 s | 700 KHz | −30 dB |
| Interference signal 2 | Gaussian noise | 60 s | 0-400 MHz | −70 dB |

TABLE 4

Subjective complexity evaluation parameter and quantitative evaluation result

| Signal style | Signal time-frequency energy occupancy rate | | | |
|---|---|---|---|---|
| | $T_P$ | $F_P$ | $E_P$ | $C_m$ |
| Interference signal 1 | 100% | 56% | 30% | 16.8% |
| Interference signal 2 | 100% | 100% | <0.01% | <0.01% |

TABLE 5

Objective complexity evaluation parameter and quantitative evaluation result

| Signal style | S-transformation time-frequency model evaluation parameter | | | | | | C |
|---|---|---|---|---|---|---|---|
| | $t_{p1}$ | $t_{p2}$ | $f_{p1}$ | $f_{p2}$ | $S_{p1}$ | $S_{p2}$ | |
| Interference signal 1 | 0-60 s | 0-60 s | 13.56 MHz | 13.56 MHz | −20 dBm | −30 dBm | 0.9 |
| Interference signal 2 | 0-60 s | 0-60 s | 13.56 MHz | 0-400 MHz | −20 dBm | −70 dBm | 0.01% |

Based on the foregoing simulation results and analysis, the electromagnetic interference objective complexity evaluation method based on the fast S-transformation time-frequency space model in the embodiment of the present invention is feasible.

Persons skilled in the art can make various modifications and changes to the present invention, if these modifications and changes are in the scope of claims of the present invention and equivalent technologies thereof, then these modifications and changes are also in the scope of protection of the present invention. Contents which are not described in details in the description are prior arts known to the persons skilled in the art.

What is claimed is:

1. An electromagnetic interference objective complexity evaluation method based on a fast S-transformation time-frequency space model, comprising the following steps:
   (1) carrying out, by a processor, fast S-transformation on space electromagnetic signals, comprising interference signals, acquired by sensors in real time to obtain a fast S-transformation two-dimensional time-frequency matrix of the space electromagnetic signals;
   (2) calculating, by the processor, time domain occupancy rate $T_P$, frequency occupancy rate $F_P$ and energy occupancy rate $E_P$ of the interference signals of an evaluation object in the fast S-transformation two-dimensional time-frequency matrix of the space electromagnetic signals according to the S-transformation two-dimensional time-frequency matrix;
   (3) calculating, by the processor, electromagnetic interference objective complexity $C=T_P*F_P*E_P$ of the interference signals according to the time-frequency space model consisting of the time domain occupancy rate, the frequency occupancy rate and the energy occupancy rate; and
   (4) determining, by the processor, a quality grade and a quantitative grade of the electromagnetic interference objective complexity of the interference signals according to the electromagnetic interference objective complexity of the interference signals.

2. The electromagnetic interference objective complexity evaluation method based on the fast S-transformation time-frequency space model according to claim 1, wherein in step (1), the fast S-transformation is a short-time Fourier transformation fast speed algorithm which takes a Gaussian function as a window function, the expression of the algorithm is $S(t,f)=\int_{-\infty}^{\infty}[G(f+f')\cdot W(f',f)]\cdot e^{i2\pi f't}df'$, in the expression, $G(f+f')=\int_{-\infty}^{+\infty}x(t)\cdot e^{-i2\pi\cdot(f+f')\cdot t}dt$ is Fourier transformation of the space electromagnetic interference signal $x(t)$ acquired in real time, $$W(f',f) = \int_{-\infty}^{+\infty}\frac{|f|}{\sqrt{2\pi}}\cdot e^{\left[-\frac{f^2(\tau-t)^2}{2}\right]}\cdot e^{-i2\pi f't}\cdot dt$$

is Fourier transformation of a window function $$\psi(t) = \frac{1}{\sqrt{2\pi}}e^{-\frac{t^2}{2}},$$

t is time, f' is sampling frequency, f is frequency, τ is a time shift factor, and i is an imaginary number.

3. The electromagnetic interference objective complexity evaluation method based on the fast S-transformation time-frequency space model according to claim 2, wherein in step (2), the time domain occupancy rate $T_P$ is $$T_P = \int_{f_1}^{f_2}\left[\frac{S(t,f)-S_0}{(t_2-t_1)(f_2-f_1)}\right]df,$$

in the expression, $t_1$ and $t_2$ are effective starting time and effective ending time respectively, $f_1$ and $f_2$ are evaluated starting frequency and evaluated ending frequency respectively, $S(t, f)$ is the fast S-transformation two-dimensional time-frequency matrix, and $S_0$ is a reference time-frequency matrix plane; the frequency occupancy rate $F_P$ is $$F_P = \int_{t_1}^{t_2}\left[\frac{S(t,f)-S_0}{(t_2-t_1)(f_2-f_1)}\right]dt;$$

and the energy occupancy rate $E_P$ is $$E_P = \frac{S(t,f)-S_0}{\max[S(t,f)]-S_0},$$

and in the expression, $\max[S(t, f)]$ is a maximum value in all elements of the S-transformation time-frequency matrix.

4. The electromagnetic interference objective complexity evaluation method based on the fast S-transformation time-frequency space model according to claim 1, wherein in step (4), the qualitative grade and the quantitative grade of the electromagnetic interference objective complexity is found by the processor through a lookup table stored in a storage device.

* * * * *